US010120021B1

(12) United States Patent
Silva et al.

(10) Patent No.: US 10,120,021 B1
(45) Date of Patent: Nov. 6, 2018

(54) THERMAL NON-CONTACT VOLTAGE AND NON-CONTACT CURRENT DEVICES

(71) Applicant: Fluke Corporation, Everett, WA (US)

(72) Inventors: Luis R. Silva, Lynnwood, WA (US); Michael D. Stuart, Issaquah, WA (US)

(73) Assignee: Fluke Corporation, Everett, WA (US)

( * ) Notice: Subject to any disclaimer, the term of this patent is extended or adjusted under 35 U.S.C. 154(b) by 40 days.

(21) Appl. No.: 15/625,812

(22) Filed: Jun. 16, 2017

(51) Int. Cl.
*G01R 31/302* (2006.01)
*G01R 31/308* (2006.01)
(Continued)

(52) U.S. Cl.
CPC ........... *G01R 31/308* (2013.01); *G01R 15/24* (2013.01); *G01R 15/181* (2013.01); *G01R 15/202* (2013.01); *G01R 15/205* (2013.01)

(58) Field of Classification Search
CPC . G01S 17/46; G01S 11/12; G01S 5/16; G01S 5/163; G01S 17/42; G01S 17/66; G01S 17/026; G01S 17/06; G01S 17/08; G01S 17/32; G01S 17/89; G01S 3/783; G01S 7/4817; G01S 7/497; G01S 15/025; G01S 15/88; G01S 3/784; A61N 2/006; A61N 5/0622; A61N 2005/067; G06T 2207/10048; G06T 2207/10152;
(Continued)

(56) References Cited

U.S. PATENT DOCUMENTS 4,074,193 A 2/1978 Kohler
4,173,970 A * 11/1979 Momin ................ A61B 5/6842
374/113
(Continued)

FOREIGN PATENT DOCUMENTS

DE 23 63 933 A1 6/1975
EP 0 218 221 A2 4/1987
(Continued)

OTHER PUBLICATIONS

Hioki, "3258 : Safety HiTESTER," Revised Edition 5, Hioki E. E. Corporation, Nagano Japan, 2 pages.
(Continued)

*Primary Examiner* — Vinh Nguyen
(74) *Attorney, Agent, or Firm* — Seed Intellectual Property Law Group LLP

(57) ABSTRACT

Systems and methods detect abnormal conditions in electrical circuits by providing thermal imaging combined with non-contact measurements of current and voltage. Such systems may be implemented in a single test device, or in wired combinations, or in wireless communication implementations with multiple test devices and/or accessories, or in combination with one or more additional devices, such as a mobile phone, tablet, personal computer (PC), cloud-based server, etc. A thermal imaging tool that includes an infrared sensor may first discover and image one or more thermal anomalies in an object, such as an electrical circuit. One or more non-contact current or voltage sensors may be used to measure current and/or voltage, which allows for determination of the power loss at the measured location. The power loss may be used to determine an estimation of the abnormal resistive power losses in a circuit, as well as the costs associated therewith.

23 Claims, 7 Drawing Sheets

(51) Int. Cl.
*G01R 15/24* (2006.01)
*G01R 15/18* (2006.01)
*G01R 15/20* (2006.01)

(58) Field of Classification Search
CPC ... G06T 2207/10016; G06T 5/00; G06T 7/13; G06T 7/20; G06T 2200/24; G06T 2207/20221; G06T 17/00; G06F 19/00; G06F 3/0325; G06F 3/0425; G06F 17/00; G06F 17/50; G01B 11/002; G01B 11/14; G01B 11/25; G01J 5/22; G01J 2005/0077; G01J 3/50; G01J 5/0066; G01J 5/0096; G01J 5/12; G01K 13/002; G01K 17/00; G01N 25/72; G01N 30/74; G01N 21/21; G01N 21/954; G01N 25/18; G01N 27/00; H02J 50/60; H02J 50/90; H02J 7/045; G02B 27/10; G02B 27/144; G02B 2027/0138; G02B 2027/0198; G01R 22/00

See application file for complete search history.

(56) References Cited

U.S. PATENT DOCUMENTS

| | | | |
|---|---|---|---|
| 4,584,523 A * | 4/1986 | Elabd | G01R 15/146 324/105 |
| 4,689,752 A | 8/1987 | Fernandes et al. | |
| 5,583,444 A | 12/1996 | Nakamura et al. | |
| 5,973,501 A | 10/1999 | Reichard | |
| 6,014,027 A | 1/2000 | Reichard | |
| 6,043,640 A | 3/2000 | Lauby et al. | |
| 6,118,270 A | 9/2000 | Singer et al. | |
| 6,177,800 B1 | 1/2001 | Kubby et al. | |
| 6,664,708 B2 | 12/2003 | Schlimak et al. | |
| 6,812,685 B2 | 11/2004 | Steber et al. | |
| 6,825,649 B2 | 11/2004 | Nakano | |
| 6,995,565 B1 * | 2/2006 | Tulloch | G01R 31/083 324/514 |
| 7,084,643 B2 | 8/2006 | Howard et al. | |
| 7,466,145 B2 | 12/2008 | Yanagisawa | |
| 8,054,061 B2 | 11/2011 | Prance et al. | |
| 8,222,886 B2 | 7/2012 | Yanagisawa | |
| 8,680,845 B2 | 3/2014 | Carpenter et al. | |
| 8,803,506 B2 | 8/2014 | Yanagisawa | |
| 9,063,184 B2 | 6/2015 | Carpenter et al. | |
| 9,201,100 B2 | 12/2015 | Yanagisawa | |
| 2002/0167303 A1 | 11/2002 | Nakano | |
| 2010/0090682 A1 | 4/2010 | Armstrong | |
| 2010/0283539 A1 | 11/2010 | Yanagisawa | |
| 2012/0068716 A1 * | 3/2012 | Reed | G01N 27/61 324/454 |
| 2012/0259565 A1 | 10/2012 | Oshima et al. | |
| 2013/0076343 A1 | 3/2013 | Carpenter et al. | |
| 2013/0124136 A1 | 5/2013 | Neeley et al. | |
| 2014/0035607 A1 | 2/2014 | Heydron et al. | |
| 2014/0062496 A1 * | 3/2014 | Kwon | G01R 31/2607 324/501 |
| 2016/0080666 A1 | 3/2016 | Stuart et al. | |
| 2016/0080667 A1 | 3/2016 | Stuart et al. | |
| 2016/0109486 A1 | 4/2016 | Yanagisawa | |
| 2016/0119592 A1 | 4/2016 | Stuart et al. | |

FOREIGN PATENT DOCUMENTS

| | | |
|---|---|---|
| EP | 1 249 706 B1 | 9/2007 |
| JP | 6-28748 U | 4/1994 |
| JP | 2000-147035 A | 5/2000 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-215900 A | 9/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2012-137496 A | 7/2012 |
| JP | 2012-177571 A | 9/2012 |
| JP | 2014-44168 A | 3/2014 |
| JP | 2014-44169 A | 3/2014 |
| JP | 2014-106220 A | 6/2014 |
| JP | 2015-111087 A | 6/2015 |
| JP | 2016-3997 A | 1/2016 |

OTHER PUBLICATIONS

Mitchell Instrument Company Inc., clipping from the Mitchell Catalogue, undated, 1 page.
Takahashi, "Clamp on Power Logger PW3365 : Safety Voltage Sensor PW9020," *HIOKI Technical Notes* 1(1): 2015, 8 pages.
Tsang et al., "Dual capacitive sensors for non-contact AC voltage measurement," *Sensors and Actuators A* 167:261-266, 2011.
Huber et al., "Non-Contact Voltage Measurement Systems," U.S. Appl. No. 62/421,124, filed Nov. 11, 2016.
Ringsrud et al., "Non-Contact Voltage Measurement System," U.S. Appl. No. 15/345,256, filed Nov. 7, 2016.
Rodriguez et al., "Non-Contact Current Measurement System," U.S. Appl. No. 15/604,320, filed May 24, 2017.
Steuer et al., "Non-Contact Electrical Parameter Measurement Systems," U.S. Appl. No. 15/625,745, filed Jun. 16, 2017.
Steuer et al., "Non-Contact Voltage Measurement System Using Multiple Capacitors," U.S. Appl. No. 15/412,891, filed Jan. 23, 2017.
Steuer et al., "Non-Contact Voltage Measurement System Using Reference Signal," U.S. Appl. No. 15/413,025, filed Jan. 23, 2017.
Neeley et al., "Maintenance Management Systems and Methods," U.S. Appl. No. 61/514,842, filed Aug. 3, 2011.
Stuart et al., "Combined Use of Digital Multimeter and Infrared Camera to Analyze and Diagnose Issues With Voltage Drop and Impedance," U.S. Appl. No. 62/051,930, filed Sep. 17, 2014.
Stuart et al., "Imaging System Employing Fixed, Modular Mobile, and Portable Infrared Cameras With Ability to Receive, Communicate, and Display Data and Images With Proximity Detection," U.S. Appl. No. 62/068,392, filed Oct. 24, 2014.
Stuart et al., "Infrared Cameras Used As a Method to Trigger Operation and/or Recording of Test and Measurement Devices," U.S. Appl. No. 62/076,088, filed Nov. 6, 2014.
European Search Report, dated Aug. 23, 2018, for European Application No. 18177845.7-1202, 8 pages.
European Search Report, dated Nov. 30, 1987, for European Application No. 86113755.2, 3 pages.

\* cited by examiner

THERMAL NON-CONTACT VOLTAGE AND NON-CONTACT CURRENT DEVICES

BACKGROUND

Technical Field

The present disclosure generally relates to non-contact measurement or detection of various properties of electrical circuits.

Description of the Related Art

High-resistance electrical connections can result in a loss of power in an electrical circuit. Such connections are commonly referred to as "resistive power losses," "copper losses," or "$I^2R$ losses." This equation is a permutation of Ohm's Law, V=IR, which describes the relationship between electrical current (I), electrical voltage (V) and electrical resistance (R). A related equation is P=VI, which indicates that power (P) is equal to the current multiplied by the voltage. From the above equations, the power loss may be determined by the equation $P=I^2R$. From this equation, it is known that the energy or power loss increases with the square of the current (I) through the conductor and in proportion to the electrical resistance (R) of the conductor.

In the case of resistive power losses in an electrical circuit, electrical energy is undesirably converted into heat energy (infrared energy), and is no longer able to perform the intended purpose as designed. There will almost always be some resistive power loss in the transmission of electrical power, but higher resistive connections increase that power loss even more, to the point where electricians and engineers refer to such situations as creating "waste heat." Individual problems of this nature may not typically be very costly from a power loss perspective on their own, but energy costs can rise over time, or when larger numbers of these issues are present in a particular facility.

Use of infrared imaging (e.g., thermography, thermal imaging) can detect patterns of heat that can indicate a high-resistance connection is present in a particular location. Unfortunately, although being able to discover the location and source of the high-resistance problem is invaluable to electricians, engineers, and other maintenance professionals, infrared imaging alone typically cannot quantify the amount of energy loss in a practical way.

BRIEF SUMMARY

A non-contact measurement system or device may be summarized as including a housing; a thermal imaging subsystem or tool disposed in or on the housing that, in operation, detects infrared radiation from a target scene that includes an electrical circuit and produces thermographic image data for the electrical circuit; a non-contact voltage measurement tool (NVMT) that, in operation, senses a voltage in an insulated conductor of the electrical circuit without galvanically contacting the insulated conductor; a non-contact current measurement tool (NCMT) that, in operation, senses a current in an insulated conductor of the electrical circuit without galvanically contacting the insulated conductor; a display subsystem; at least one nontransitory processor-readable storage medium that stores at least one of processor-executable instructions or data; and at least one processor communicatively coupled to the at least one nontransitory processor-readable storage medium, the thermal imaging tool, the NVMT, the NCMT, and the display subsystem, in operation the at least one processor: receives thermographic image data from the thermal imaging tool; presents the thermographic image data via the display subsystem that indicates a presence or absence of abnormal heat generation locations in the electrical circuit; and receives measurement data from at least one of the NVMT or the NCMT, the measurement data comprising at least one of a voltage sensor signal from the NVMT or a current sensor signal from the NCMT, the voltage sensor signal indicative of the voltage in an insulated conductor of the electrical circuit under test, and the current sensor signal indicative of the current in an insulated conductor of the electrical circuit under test. The housing may have no externally exposed conductive surfaces. At least one of the NVMT, the NCMT, or the display subsystem may be disposed in or on the housing. The NVMT and the NCMT may each be disposed in or on the housing. At least one of the NVMT or the NCMT may be disposed in a separate housing and may be communicatively coupleable to the at least one processor via a wired or wireless connection. In operation, the at least one processor may determine at least one electrical parameter based on the received measurement data, the determined at least one electrical parameter includes power.

In operation, the at least one processor may estimate an amount of power loss in an insulated conductor of the electrical circuit over a period of time; and at least one of: present the estimated amount of power loss via the display subsystem; or communicate the estimated amount of power loss to an external device over a wired or wireless communications interface. The period of time may include at least one of a number of days, a number of weeks, a number of months, or a number of years. In operation, the at least one processor may estimate the amount of power loss in the insulated conductor relative to an expected amount of power loss in the insulated conductor. In operation, the at least one processor may determine an estimated cost associated with the estimated amount of power loss; and present the estimated cost via the display subsystem. The NVMT may include at least two non-contact voltage sensors which allow for concurrent measurement of two different locations of the electrical circuit. The NCMT may include at least one of a fluxgate sensor, a Hall Effect sensor, a Rogowski coil, a current transformer, or a giant magnetoresistance (GMR) magnetic sensor. The NVMT may include at least one of a capacitive divider type voltage sensor, a reference signal type voltage sensor, or a multi-capacitor type voltage sensor.

In operation, the at least one processor may receive a voltage sensor signal from the NVMT obtained by the NVMT during a measurement time interval; receive a current sensor signal from the NCMT obtained by the NCMT during the measurement time interval; and determine at least one alternating current (AC) electrical parameter based on the received voltage sensor signal and the received current sensor signal. In operation, the at least one processor may cause the display subsystem to present the determined at least one AC electrical parameter.

The non-contact measurement device may further include a wired or wireless communications interface operatively coupled to the at least one processor, wherein, in operation, the at least one processor sends, via the communications interface, data to at least one external device, wherein the data is associated with at least one of the thermographic image data, the voltage sensor signal, the current sensor signal, or the determined at least one AC electrical parameter. The communications interface may include a wireless communications interface that, in operation, wirelessly sends the data to the at least one external device.

A method of operating a non-contact measurement device may be summarized as including detecting, via a thermal imaging tool disposed in or on a housing of the non-contact measurement device, infrared radiation from a target scene that includes an electrical circuit; producing, via the thermal imaging tool, thermographic image data for the electrical circuit; receiving, by at least one processor, the thermographic image data from the thermal imaging tool; presenting, via a display subsystem, the thermographic image data that indicates a presence or absence of abnormal heat generation locations in the electrical circuit; at least one of: sensing, via a non-contact voltage measurement tool (NVMT), a voltage in an insulated conductor of the electrical circuit without galvanically contacting the insulated conductor; or sensing, via a non-contact current measurement tool (NCMT), a current in an insulated conductor of the electrical circuit without galvanically contacting the insulated conductor; receiving, by the at least one processor, measurement data from at least one of the NVMT or the NCMT, the measurement data comprising at least one of a voltage sensor signal from the NVMT or a current sensor signal from the NCMT, the voltage sensor signal indicative of the voltage in an insulated conductor of the electrical circuit under test, and the current sensor signal indicative of the current in an insulated conductor of the electrical circuit under test; and determining, by the at least one processor, at least one alternating current (AC) electrical parameter based on the received measurement data. The method may include sensing, via a non-contact voltage measurement tool (NVMT), a voltage in an insulated conductor of the electrical circuit without galvanically contacting the insulated conductor; and sensing, via a non-contact current measurement tool (NCMT), a current in an insulated conductor of the electrical circuit without galvanically contacting the insulated conductor, wherein determining at least one AC electrical parameter comprises determining AC power.

The method may further include estimating, by the at least one processor, an amount of power loss in an insulated conductor of the electrical circuit over a period of time; and at least one of: presenting the estimated amount of power loss via the display subsystem; or communicating the estimated amount of power loss to an external device over a wired or wireless communications interface.

The method may further include determining, by the at least one processor, an estimated cost associated with the estimated amount of power loss; and presenting the estimated cost via the display subsystem. Sensing a voltage in an insulated conductor of the electrical circuit without galvanically contacting the insulated conductor the NVMT may include concurrently sensing two different locations of the electrical circuit with two non-contact voltage sensors to obtain a voltage drop between the two different locations of the electrical circuit.

A non-contact measurement device may be summarized as including a thermal imaging tool that, in operation, detects infrared radiation from a target scene that includes an electrical circuit and produces thermographic image data for the electrical circuit; a non-contact voltage measurement tool (NVMT) that, in operation, senses a voltage in an insulated conductor of the electrical circuit without galvanically contacting the insulated conductor; a non-contact current measurement tool (NCMT) that, in operation, senses a current in an insulated conductor of the electrical circuit without galvanically contacting the insulated conductor; at least one nontransitory processor-readable storage medium that stores at least one of processor-executable instructions or data; and at least one processor communicatively coupled to the at least one nontransitory processor-readable storage medium, the thermal imaging tool, the NVMT, and the NCMT, and in operation the at least one processor: receives thermographic image data from the thermal imaging tool; provides an indication of a presence or absence of abnormal heat generation locations in the electrical circuit based at least in part on the received thermographic image data; receives measurement data from at least one of the NVMT or the NCMT, the measurement data comprising at least one of a voltage sensor signal from the NVMT or a current sensor signal from the NCMT, the voltage sensor signal indicative of the voltage in an insulated conductor of the electrical circuit under test, and the current sensor signal indicative of the current in an insulated conductor of the electrical circuit under test; and presents at least a portion of the measurement data via the display subsystem in connection with providing an indication based at least in part on the received thermographic image data.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
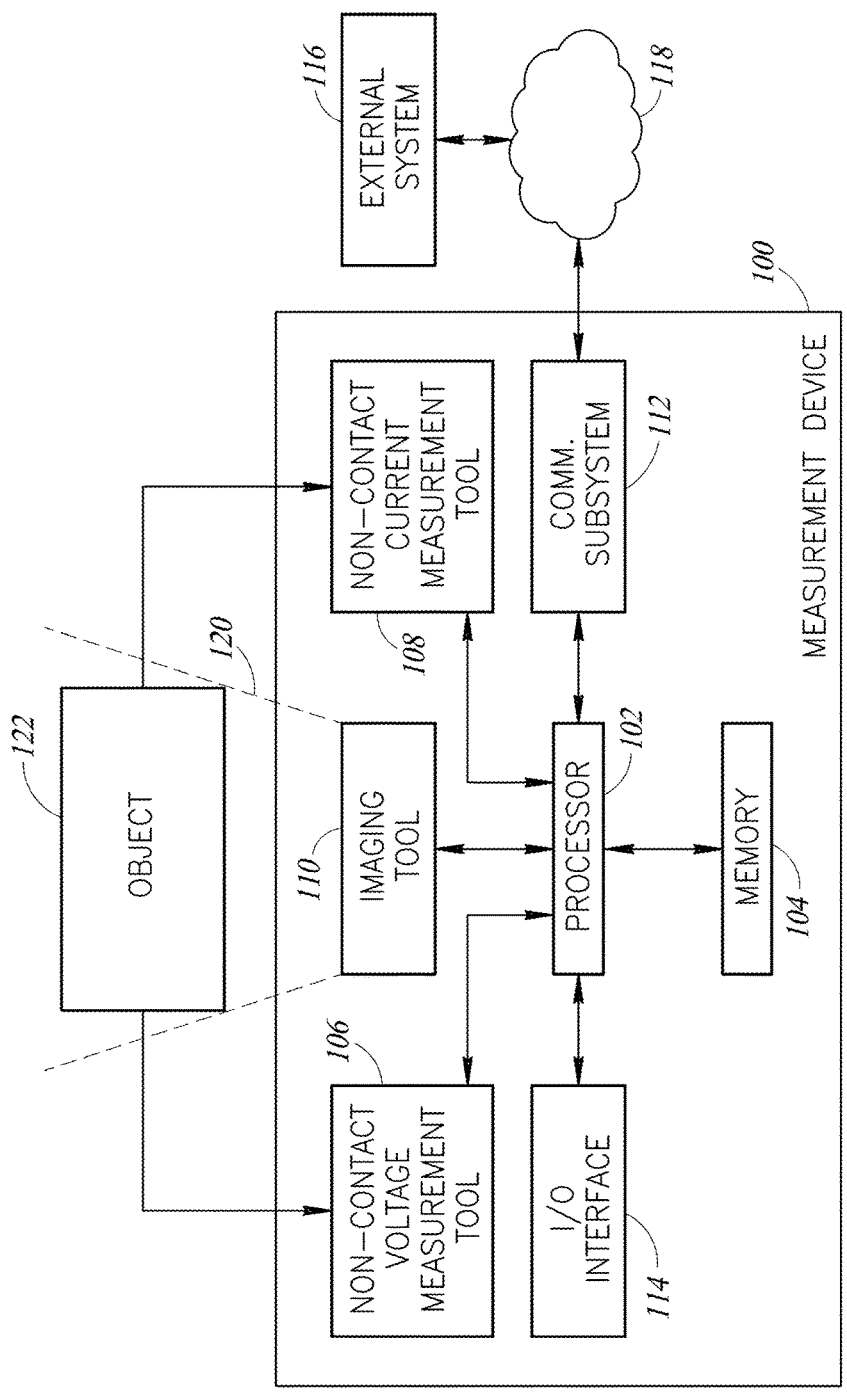
FIG. 1 is a schematic block diagram of a thermal non-contact voltage and non-contact current measurement device, according to one illustrated implementation.

One or more implementations of the present disclosure provide systems and methods that provide thermal imaging and non-contact voltage or current measurement sensors to detect or measure abnormal conditions in electrical circuits. Such systems and methods may be implemented in a single test device, or in wired combinations, or in wireless communication implementations with multiple test devices and/or accessories, or in combination with one or more additional devices, such as a mobile phone, tablet computer, personal computer (PC), cloud-based server, etc.

In at least some implementations, a thermal imaging subsystem or tool of a measurement device that includes an infrared sensor may first discover and image one or more thermal anomalies in an object, such as an electrical circuit. Either the user, or the measurement device, may then analyze the detected heat pattern, which may be indicative of either localized high-resistance electrical connections, or high-resistance due to incorrect conductor or component sizing. For example, an insulated wire may have a diameter that is too small for the amount of current that the wire carries. As another example, a connector may be damaged or may be installed improperly, thereby causing a higher impedance than intended. The non-contact current sensor tool of the measurement device may be used to measure the current load in the immediate area of the thermal anomaly. Similarly, the non-contact voltage sensor tool of the measurement device may measure the voltage in the immediate area of the thermal anomaly. When properly synchronized, the measurement device, or an external device to which measurement data is transferred, may then determine the power loss at the measured location using the measured current data and voltage data. When compared to the intended, theoretical power loss in the circuit, the measured power loss may be used to determine an estimation of the abnormal resistive power losses in the area of the circuit.

Furthermore, in at least some implementations, the measurement device may utilize power cost information to calculate an estimation of the cost of the power loss over time (e.g., days, weeks, months, years). For example, the power cost information (e.g., price per kilowatt-hour) may be input manually by a user, or may be stored in a local or remote storage device accessible by the measurement device or a device communicatively coupled to the measurement device. The cost information may be used along with the determined power loss to estimate the cost of the power loss over time. This power cost estimation may then be used by decision makers to make economically sound repair decisions, or may be used in estimations needed for energy efficiency audits and calculations in facilities in which these problems exist and the tools are used.

In at least some implementations, the measurement device may be used for the discovery, documentation, and quantification of reactive power losses due to the presence of some types of electrical loads or equipment which often create unintentional cost of operation ramifications for industrial and commercial facilities. The various implementations of the present disclosure are discussed in detail below with reference to the figures.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

FIG. 1 shows a schematic block diagram of a handheld thermal non-contact voltage and non-contact current measurement device 100 ("measurement device"), according to one or more implementations of the present disclosure. The measurement device 100 may be operative to determine one or more AC electrical parameters (e.g., voltage, current, power, energy, frequency, harmonics) obtained from non-contact current or voltage measurements or derived from non-contact voltage or current measurements. The measurement device 100 may be a "handheld device" or system generally configured to be held in a user's hand while taking a measurement. However, it should be appreciated that the measurement device 100 need not always be held in a user's hand and may be positioned by a user to not be held, for example, by affixing or hanging the system or device from a support or from a machine. In other implementations, the measurement device 100 may be designed to be removably or permanently positioned at a particular location to monitor and measure one or more electrical circuits.

The measurement device 100 includes a processor 102, nontransitory processor-readable storage medium or memory 104, a non-contact voltage measurement tool (NVMT) 106, a non-contact current measurement tool (NCMT) 108, an imaging tool 110, a communications subsystem or interface 112, and an I/O interface 114. In at least some implementations, the measurement device 100 may not include each of the aforementioned components or may include additional components not depicted in FIG. 1. The various components of the measurement device 100 may be powered by at least one removable or non-removable battery, by electrical mains, by an inductive power system, by a thermal energy conversion system, etc. Further, the various components of the measurement device 100 may be disposed in or on a single housing, or may be distributed across multiple physical devices or tools that are communicatively coupled together via wired and/or wireless communication channels. In at least some implementations, the measurement device 100 has no exposed conductive components, which eliminates the possibility of the measurement device 100 making galvanic contact with an electrical circuit.

The processor 102 may serve as the computational center of the measurement device 100 by supporting the execution of instructions. The processor 102 may include an image processor for processing optical data. The processor 102 may include one or more logic processing units, such as one or more central processing units (CPUs), microprocessors, digital signal processors (DSPs), application-specific integrated circuits (ASICs), field programmable gate arrays (FPGAs), etc. The memory 104 may include one or more forms of nontransitory processor-readable storage media, which may include any currently available or later developed storage media suitable for storing programs or data that is accessible by one or more device components, such as the processor 102. The memory 104 may be removable or non-removable and may be volatile or non-volatile. Non-limiting examples of memory include hard drives, optical drives, RAM, ROM, EEPROM, and flash types of memory.

The communications subsystem 112 may include one or more components for communicating with an external device 116 over one or more wired or wireless communications networks 118 (e.g., Internet). The external device 116 may be a mobile phone, tablet computer, personal computer (PC), cloud-based server, etc. Non-limiting examples of wireless communications interfaces 112 include Wi-Fi®, Bluetooth®, Bluetooth® Low Energy, Zigbee®, 6LoWPAN®, Optical IR, wireless HART, etc. Non-limiting examples of wired communications interfaces 112 include USB®, Ethernet, PLC, HART, MODBUS, FireWire®, Thunderbolt®, etc. Further, in addition to sending data to the external device 116, in at least some implementations the measurement device 100 may receive at least one of data or instructions (e.g., control instructions) from the external device 116 via the wired or wireless communications interface 112.

The I/O interface 114 may include one or more input devices and a display subsystem, for example. Generally, the I/O interface 114 may include any device that allows a user or an external system to interact with the processor 102 and any device that allows the processor 102 to display information, such as images. In at least one implementation, the I/O interface 114 allows a user to control or configure the measurement device 100 to perform a particular measurement or to request particular data from the measurement device 100. As discussed in more detail below, information regarding the particular configuration of mobile measurement device 100 may be stored in the memory 104. The display subsystem of the I/O interface 114 may be, for example, a liquid crystal display (LCD) device, light emitting diode (LED) display, etc. In at least some implementations, the display subsystem may be capable of displaying color images. In at least some implementations, the display subsystem of the I/O interface 114 may include a touchscreen which allows for user input. In response to an input by a user to the I/O interface 114, the display subsystem may display information or data related to a specific measurement. As discussed in further detail below, the display subsystem of the I/O interface 114 may display one or more images corresponding to optical data received by the imaging tool 110.

The I/O interface 114 may include a single input device or a combination of input devices configured to communicate an input to the processor 102 of the measurement device 100. Non-limiting examples of input devices include buttons, a keypad, a touchpad, switches, selectors, a rotary switch, or other known or later developed input devices. As mentioned above, the I/O interface 114 may include an input device that is incorporated into a display subsystem as a touchscreen. In at least some implementations, the measurement device 100 operates to perform a particular type of measurement in response to a user input or selection that is input to an input device of the I/O interface 114. The particular measurement configuration may be configurable by modifying measurement setting data, for example. In at least some implementations, setting data may be associated with particular measurement data and stored in the memory 104. In one example, if a user presses a particular button of an input device of the I/O interface 114, it may configure the type of measurement performed by the measurement device 100. As another example, if a particular button is pressed, the thermal imaging tool 110 may respond by sensing optical data in a target scene 120 that includes an object 122 (e.g., electrical circuit) under inspection.

The NVMT 106 and/or NCMT 108 may be any suitable "non-contact" voltage sensor tools and current sensor tools, respectively, which are able to obtain measurements with requiring a galvanic connection between a conductor under test and a test electrode or probe. Thus, it should be understood that the term "non-contact" refers to galvanic contact rather than physical contact. Non-limiting examples of types of NCMTs include fluxgate sensors, Hall Effect sensors, Rogowski coils, current transformers, giant magnetoresistance (GMR) magnetic sensors, etc. Non-limiting examples of types of NVMTs include "capacitive divider" type voltage sensors, "reference signal" type voltage sensors, "multi-capacitor" type voltage sensors, etc.

Generally, capacitive divider type voltage sensor tools or systems measure AC voltage of an insulated conductor (e.g., insulated wire) without requiring a galvanic connection between the conductor and a test electrode or probe. A capacitive divider type voltage sensor tool may include a variable capacitance tool that operates to generate a variable capacitive voltage between an insulated conductor under test and earth ground or other reference. During measurement, the non-contact voltage measurement device varies the capacitance of the variable capacitance tool to change the impedance of a capacitive divider circuit between the insulated conductor under test and earth ground. By sequentially making two (or three) measurements across the variable capacitance tool, the AC voltage of the insulated conductor can be determined without requiring any galvanic connection to the insulated conductor.

Generally, a "reference signal" type voltage sensor tool may be a non-contact voltage sensor tool that includes a conductive sensor, an internal ground guard and a reference shield. A common mode reference voltage source may be electrically coupled between the internal ground guard and the reference shield to generate an AC reference voltage which causes a reference current to pass through the conductive sensor. At least one processor may receive a signal indicative of current flowing through the conductive sensor due to the AC reference voltage and the AC voltage in the insulated conductor, and determines the AC voltage in the insulated conductor based at least in part on the received signal.

Generally, a "multi-capacitor" type voltage sensor tool may include a plurality of conductive sensors which capacitively couple with an insulated conductor. Each of the plurality of sensors may differ from the other of the conductive sensors with respect to at least one characteristic which affects capacitive coupling. At least one processor receives signals indicative of the voltages at the conductive sensors due to the AC voltage in the insulated conductor, and determines the AC voltage in the insulated conductor based at least in part on the received signals.

Various non-limiting examples of such non-contact sensor tools are disclosed in U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, the contents of which are incorporated herein by reference, in their entirety.

The imaging tool 110 includes at least an infrared (IR) thermal imaging device or tool, and optionally includes a visible light (VL) imaging tool. In at least some implementations, the imaging tool 110 may be capable of detecting any combinations of visible light (VL), near infrared (NIR), short-wavelength infrared (SWIR), long-wavelength infrared (LWIR), terahertz (THz), ultraviolet (UV), X-ray, or other wavelengths. In implementations wherein the imaging tool 110 includes a VL imaging tool, the measurement device 100 may present images to the user that are a combination (e.g., overlay) of VL images and thermal images or images detected at other non-VL wavelengths.

In operation, the measurement device 100 may be manipulated by a user such that the imaging tool 110 is directed to capture images of the object 122 (e.g., an electrical circuit or portion thereof) in the target scene or field of view 120 of the imaging tool 110. The imaging tool 110 may capture one or more thermal images, and optionally one or more visible light images, which images may be displayed on the display subsystem of the I/O interface 114 of the measurement device 100. The user may utilize the images to detect locations of abnormal heat generation in the object 122 under inspection. Alternatively, the measurement device 100 may perform image analysis to automatically detect one or more locations of abnormal heat generation in the object 122. Such rapid identification of potential locations of concern may be advantageous for objects such as electrical circuits that have numerous (e.g., tens, hundreds, thousands) locations that would otherwise need to be tested manually for potential abnormal heat generation issues.

The user may then utilize at least one of the NVMT 106 or the NCMT 108 to obtain voltage or current measurements, respectively, at the one or more locations identified as having abnormal heat generation via the thermal imaging tool 110. For example, the thermal image data may show a heat pattern proximate a conductor connection point that indicates an area of higher heat dissipation in which a heating pattern trails off according to a decreasing gradient along the conductor or component as the distance from that area increases (see, e.g., FIG. 7). The NVMT 106 or the NCMT 108 may be used to obtain one or more readings at, or near, the point of highest resistance as indicated by the infrared image from the thermal imaging tool 110, which indicates excessive heating. As an example, the NVMT 106 may be used to obtain voltage measurements on both sides of a heated area of a conductor to obtain a voltage drop across the area. The NCMT 108 may additionally or alternatively be used to obtain current measurements of the heated area of the conductor. Using such information, the measurement device may determine the amount of power loss in the heated area due to $I^2R$ losses or "copper losses." In at least some implementations, at least two of the NVMT 106, NCMT 108, and imaging tool 110 are able to obtain measurements concurrently with each other which may allow for more accurate measurements.

In operation, the processor 102 receives signals from the NVMT 106 and the NCMT 108 to obtain voltage and current measurements, respectively. The processor 102 may utilize such voltage and current measurements to derive additional AC electrical parameters based on a combination of the measurements. Such parameters may include, for example, power (e.g., true power, apparent power, etc.), phase (e.g., three-phase), frequency, harmonics, energy, etc.

In at least some implementations, the voltage and current sensor signals may be obtained by the respective NVMT 106 and NCMT 108 during a common or overlapping measurement time interval, which may be relatively short in duration (e.g., 10 milliseconds (ms), 100 ms, 1 second, 10 seconds, 30 seconds). For example, the NVMT 106 and the NCMT 108 may obtain measurements at least partially concurrent with each other. As another example, one of the NVMT 106 and the NCMT 108 may obtain a measurement substantially immediately after the other of the NVMT and the NCMT obtains a measurement, such that the measurements are obtained at nearly the same time. In some implementations, the NVMT 106 and the NCMT 108 may be operative to repeatedly obtain measurements, concurrently or in succession, at specified intervals (e.g., every 10 ms, every 100 ms, every 1 second, every 10 seconds). Generally, in at least some implementations, the NVMT 106 and the NCMT 108 both obtain their respective measurements within a measurement time interval that is sufficiently short such that pairs of the voltage and current measurements correspond to each other, which allows for accurate derivation or determination of one or more AC electrical parameters (e.g., power, phase) using the obtained current and voltage measurements.

The processor 102 may cause the display subsystem of the I/O interface 114 to present one or more of the measured or derived parameters, and may provide graphical representations of one or more characteristics. Such graphical representations may include waveforms, harmonic bar graphs, etc. Example signal characteristics which may be presented via the display subsystem of the I/O interface 114 include voltage, current, frequency, power parameters (e.g., watts, KVA), phase, energy, harmonics, phase sequence detection, etc. The user may then utilize the information to take appropriate action if necessary, such as replacing a connection or conductor that has abnormal heat generation.

In at least some implementations, one or both of the NVMT 106 and the NCMT 108 may each include multiple sensor tools (e.g., 2 sensor tools, 3 sensor tools, 6 sensor tools), which may allow for improved measurements or, in the case of voltage, may allow for a voltage drop across a particular component (e.g., connector) to be measured easily. In at least some implementations, using the obtained measurements, the measurement device 100 may calculate power loss by comparing the measured conditions to theoretical or expected conditions for the object under inspection. In at least some implementations, the measured power loss may be compared to baseline power loss measurements previously obtained for the particular object under inspection or for objects that are similar or identical to the object under inspection.

In at least some implementations, the measurement device 100 may be programmed with power usage cost information (e.g., price per kilowatt-hour), which allows the measurement device 100 or a device communicatively coupled to the measurement device, to estimate the total cost of the individual high-resistance location over time if left unattended. In at least some implementations, the measurement device 100 may further estimate additional cost if the condition deteriorates to worse levels over time. Such features assist decision makers regarding whether to repair components, and also provide a way to prioritize repairs of multiple discovered issues based on cost and/or the potential for worsening conditions.

In at least some implementations, the I/O interface 114 of the measurement device 100 may generate alarm signals (e.g., audible, visual, signal) when certain criteria are observed by one or more of the imaging tool 110, the NVMT 106, and the NCMT 108.

FIGS. 2A-6 shows various example implementations of measurement devices that utilize thermal imaging, non-contact voltage measurement, and/or non-contact current measurement to detect abnormal conditions in electrical circuits. Each of the measurement devices discussed below may include some or all of the components and features of the measurement device 100 discussed above.

Figures 2A, 2B:
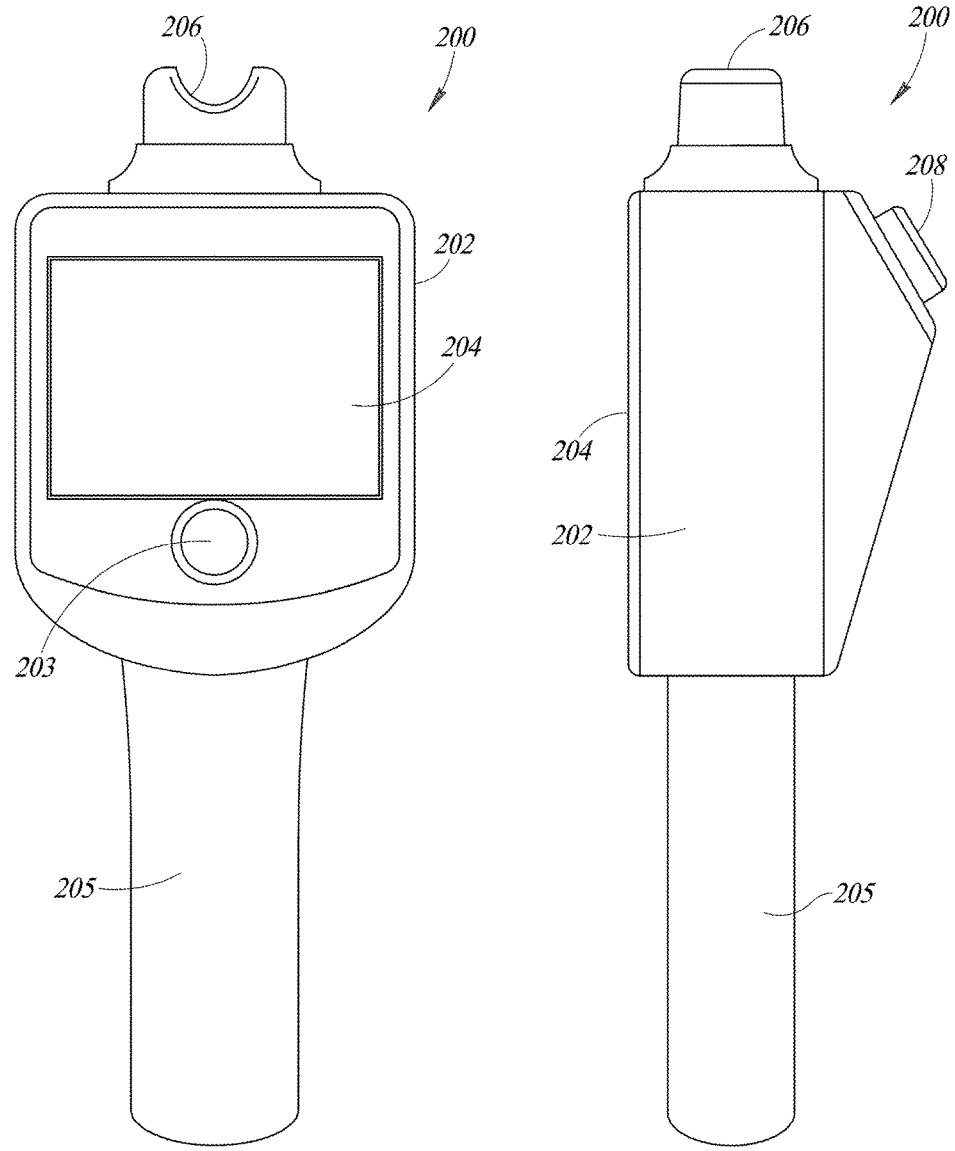
FIG. 2A is a front elevational view of a thermal non-contact voltage and non-contact current measurement device, according to one illustrated implementation.
FIG. 2B is right side elevational view of the thermal non-contact voltage and non-contact current measurement device of FIG. 2A, according to one illustrated implementation.

FIGS. 2A and 2B show an example measurement device 200. The measurement device 200 may include some or all of the components and features of the measurement device 100 of FIG. 1 discussed above. The measurement device 200 includes a housing 202, an input interface 203, a display subsystem 204, and a handle portion 205 which may be grasped by a user. The input interface 203 may include one or more buttons, dials, touchpads, etc. The input interface 203 may also be integrated with the display subsystem 204 as a touchscreen, for example. The housing 202 of the measurement device 200 includes a front end portion 206 which includes at least one non-contact sensor tool that may be used to measure at least one of voltage and current. For example, the front end portion 206 may include a non-contact voltage sensor tool, a non-contact current sensor tool, a single non-contact sensor tool that is capable of measuring both current and voltage, or any combination thereof.

The housing 202 of the measurement device 200 also includes a thermal imaging tool 208 (FIG. 2B) that is operative to capture thermal images of an object, such as an electrical circuit. In operation, the imaging tool 208 of the measurement device 200 may provide visual images (e.g., infrared, VL images) on the display 204, and may optionally be laser guided. The user may then position the front end portion 206 proximate a location of the electrical circuit determined to have abnormal heat generation. Once the front end portion 206 is positioned, the measurement device 200 may obtain at least one of current and voltage measurements, which may be used to determine power loss as well as the cost of such power loss over time. In at least some implementations, the measurement device 200 is communicatively coupleable to an external processor-based device (e.g., smartphone, tablet computer, server, another measurement instrument) via a wired and/or wireless communications interface (e.g., USB, spiral cable, Bluetooth® Low Energy, Wi-Fi®).

Figure 3:
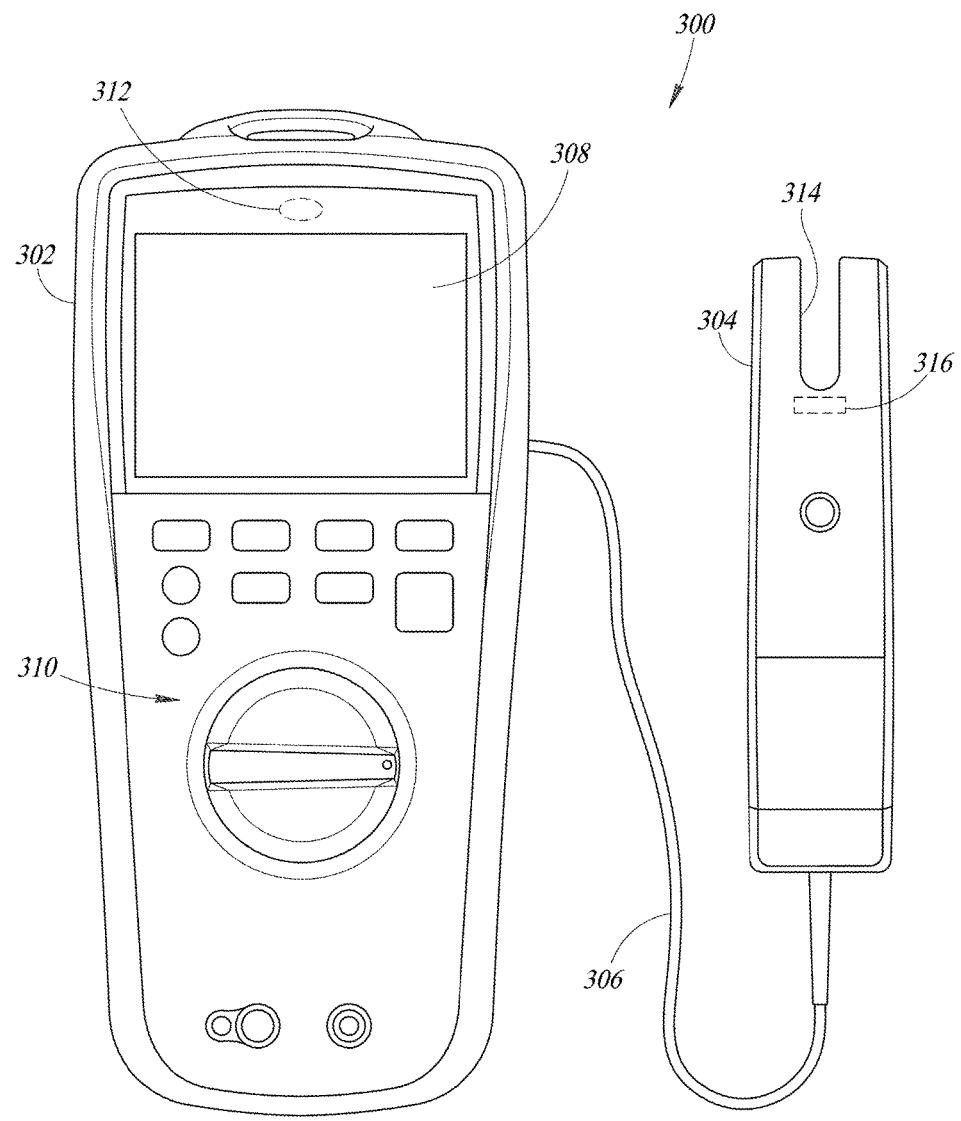
FIG. 3 is a pictorial diagram of a thermal non-contact voltage and non-contact current measurement device that includes a non-contact sensor device coupled to a master device via a wired connection, according to one illustrated implementation.

FIG. 3 shows another example of a measurement device 300, according to one illustrated implementation. The measurement device 300 includes a first housing 302 and a second housing 304 coupled together by a cable 306 or other wired connection. In this example, the first housing 302 includes a display subsystem 308, a user interface 310, and a thermal imaging tool 312 (shown in dashed lines). The second housing 304 is a handheld device that includes a front end portion 314 that includes at least one non-contact sensor 316 for measurement of at least one of voltage or current. For example, the at least one non-contact sensor 316 may include at least one non-contact voltage sensor only, at least one non-contact current sensor only, at least one non-contact voltage sensor and at least one non-contact current sensor, or at least one non-contact sensor capable of sensing both voltage and current.

In operation, a user may direct the imaging tool 312 in or on the first housing 302 toward an object to be inspected. The imaging tool 312 may display thermal image data on the display subsystem 308, which allows the user to identify locations that potentially have abnormally high heat generation. Additionally or alternatively, the measurement device 300 may analyze the image data to automatically identify one or more locations that are producing abnormally high amounts of heat. The user may concurrently or subsequently position the front end portion 314 of the second housing 304 proximate the location(s) determined to have excessive heat so that at least one of the voltage and current of the location may be measured without galvanic connection between the conductor under inspection and the sensor 316. As discussed above, the measurement device 300 may utilize such measurements to determine absolute power loss, relative power loss compared to an expected or theoretical power loss, estimated cost of power loss, etc. The measurement device 300 may then cause one or more of the determined parameters to be presented to the user via the display subsystem 308.

Figure 4:
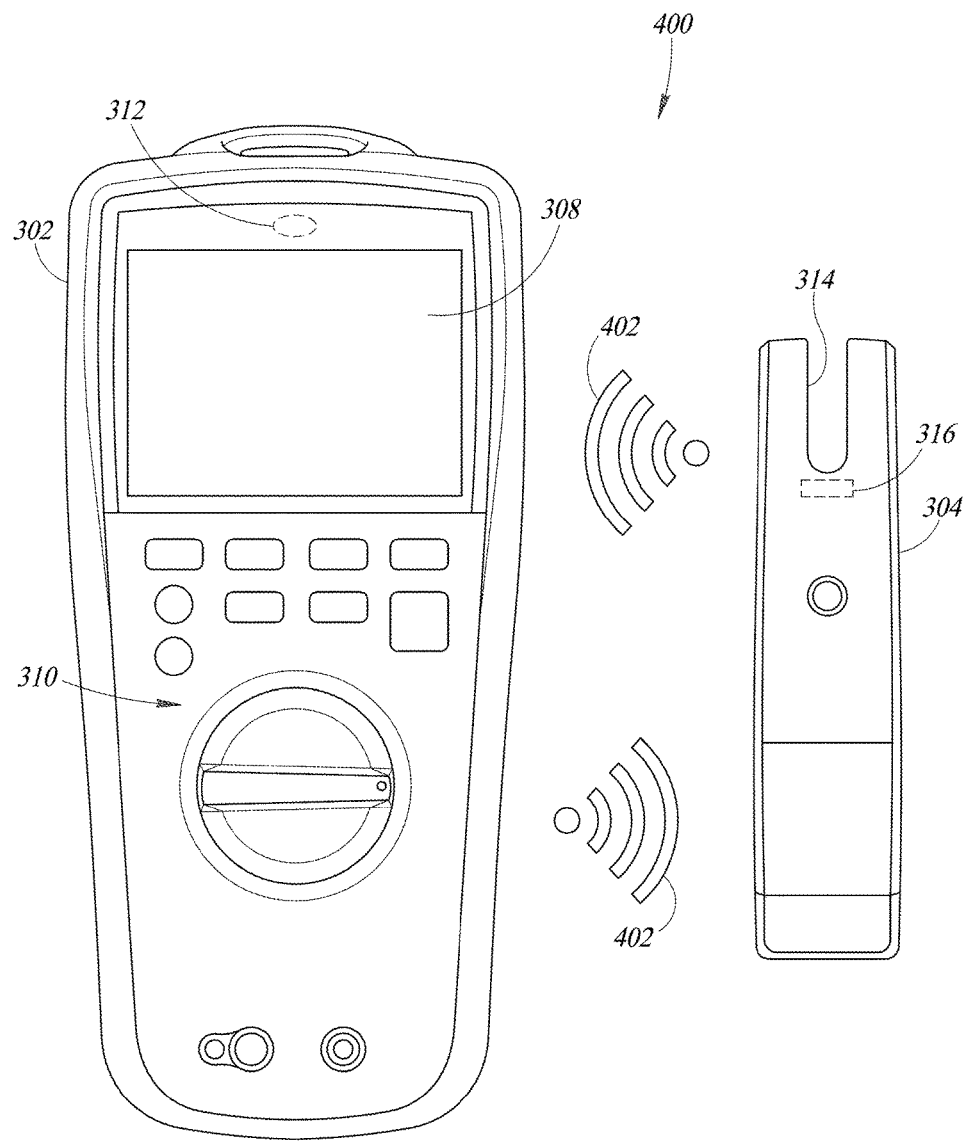
FIG. 4 is a pictorial diagram of a thermal non-contact voltage and non-contact current measurement device that includes a non-contact sensor device coupled to a master device via a wireless connection, according to one illustrated implementation.

FIG. 4 shows another example of a measurement device 400, according to one illustrated implementation. The measurement device 400 is similar to the measurement device 300 of FIG. 3 in many respects. In this implementation, rather than communicating via the cable 306 (FIG. 3), the components of the first housing 302 communicate with the components of the second housing 304 via a wireless interface (e.g., Bluetooth®, Bluetooth Low Energy®, Wi-Fi®), as indicated by wireless signals 402.

Figure 5:
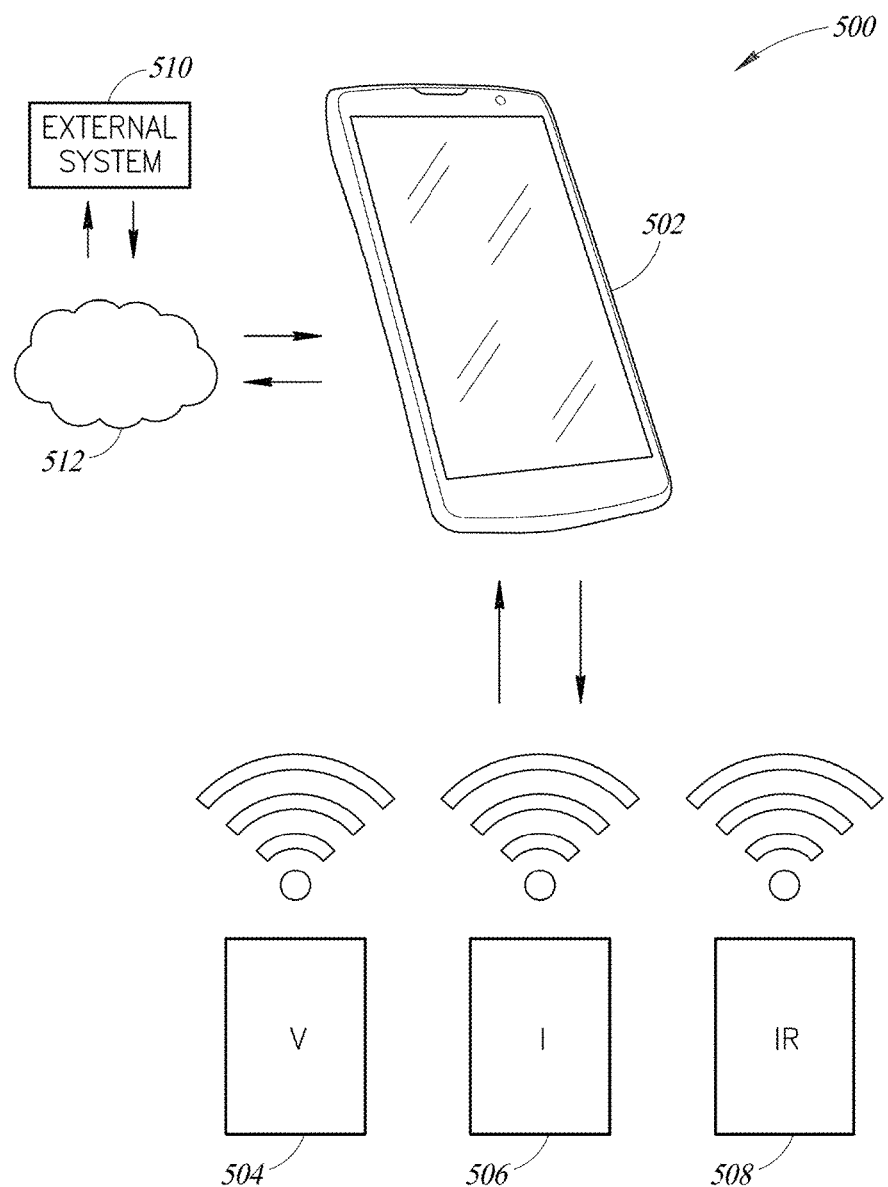
FIG. 5 is a schematic diagram of a thermal non-contact voltage and non-contact current measurement device that includes a non-contact voltage measurement device, a non-contact current measurement device, and a non-contact thermal imaging device that communicate wirelessly with a mobile device and/or a remote external device, according to one illustrated implementation.

FIG. 5 shows another implementation of a measurement device 500, according to one illustrated implementation. The measurement device 500 comprises a mobile device 502, a non-contact voltage measurement tool 504, a non-contact current measurement tool 506, and a thermal imaging tool 508. The mobile device 502 may be any of a variety of types of mobile devices including, but not limited to, a mobile phone, a tablet computer, a personal computer, a measurement instrument (e.g., DMM), etc. In this implementation, each of the non-contact voltage measurement tool 504, the non-contact current measurement tool 506, and the thermal imaging tool 508 is configured to wirelessly communicate with the mobile device 502. Such communication may include communication of instructions or data (e.g., measurement data). In some implementations, at least two of the non-contact voltage measurement device tool, the non-contact current measurement tool 506, and the thermal imaging device tool may be combined into a single housing.

In operation, the mobile device 502 may receive and display imaging data, receive and display voltage and current measurement data, and determine or estimate various parameters (e.g., voltage, current, power loss, cost of power loss) for presentation to a user of the measurement device 500. The mobile device 502 may also send data or instructions to an external system 510 or may receive data or instructions from the external system over one or more wired or wireless communications networks 512. The external system 512 may include any type of system, such as a personal computer, a server, a cloud-based server, etc.

In some implementations, the mobile device 502 or another device may function as a gateway device between the non-contact voltage measurement device tool, non-contact current measurement tool 506, a thermal imaging tool 508, and the external system 510. In such instances, the mobile device 502 may not perform any computations, and may not display image data, but instead may communicate instructions or data between the external system 510 and the sensor tools 504, 506 and 508. In some implementations, the sensor tools 504, 506 and 508 may be operative to communicate directly with the external system 510 (e.g., cloud-based server) over one or more wired or wireless networks without requiring a gateway device.

Figure 6:
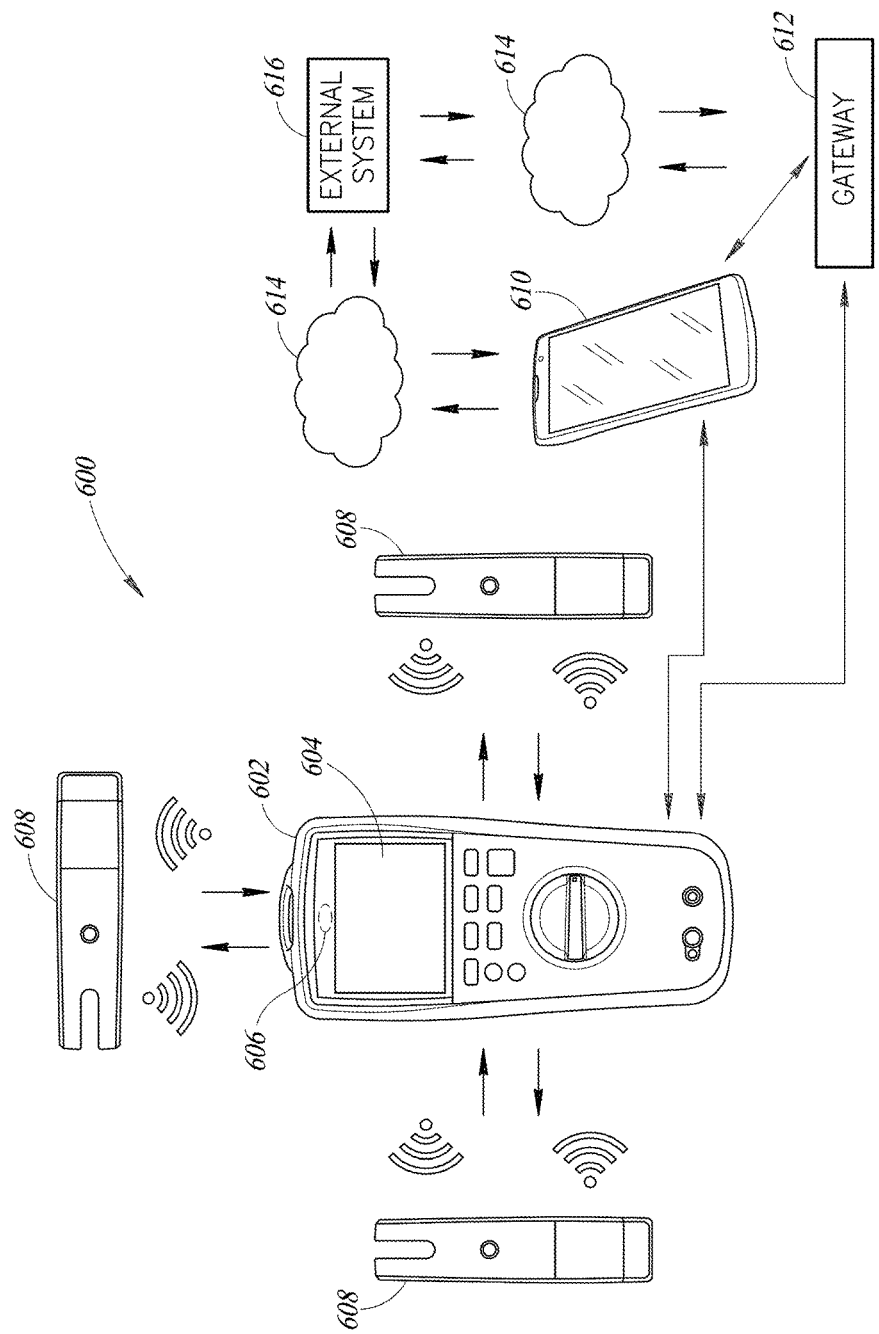
FIG. 6 is a pictorial diagram of a thermal non-contact voltage and non-contact current measurement device that includes a master device and a plurality of wireless non-contact sensor devices, according to one illustrated implementation.

FIG. 6 is a pictorial diagram of a measurement device 600, according to one illustrated implementation. The measurement device 600 includes a master device 602 which includes a display subsystem 604 and an imaging tool 606. The measurement device 600 also includes a plurality (three shown) of wireless non-contact sensor tools 608 ("slave tools"). Each of the wireless non-contact sensor tools 608 may be operative to measure non-contact voltage, non-contact current, or both. The wireless non-contact sensor tools 608 may wirelessly communicate with the master device 602 over a suitable wireless communications protocol (e.g., Wi-Fi®, Bluetooth®, Bluetooth® Low Energy, Zigbee®, 6LoWPAN®, Optical IR, wireless HART). In other implementations, at least one of the measurement tools 608 may communicate with the master device 602 via a cable or other wired communications channel (e.g., USB®, Ethernet, PLC, HART, MODBUS, FireWire®, Thunderbolt®).

The master device 602 may be operative to communicate wirelessly with a mobile device 610, either directly or through a gateway device 612. In turn, the mobile device 610 or the gateway device 614 may be operative to communicate wirelessly with a remotely located external system 616 (e.g., PC, server) over one or more networks 614. In some implementations, the master device may be able to communicate with the external system 616 over the one or more networks 614 without requiring communication with a mobile device 610 or a gateway device 612. Generally, it should be appreciated that the present disclosure contemplates various combinations of connectivity between the master device 602, the sensor tools 608, the mobile device 610, the gateway device 612, and the external system 616.

Figure 7:
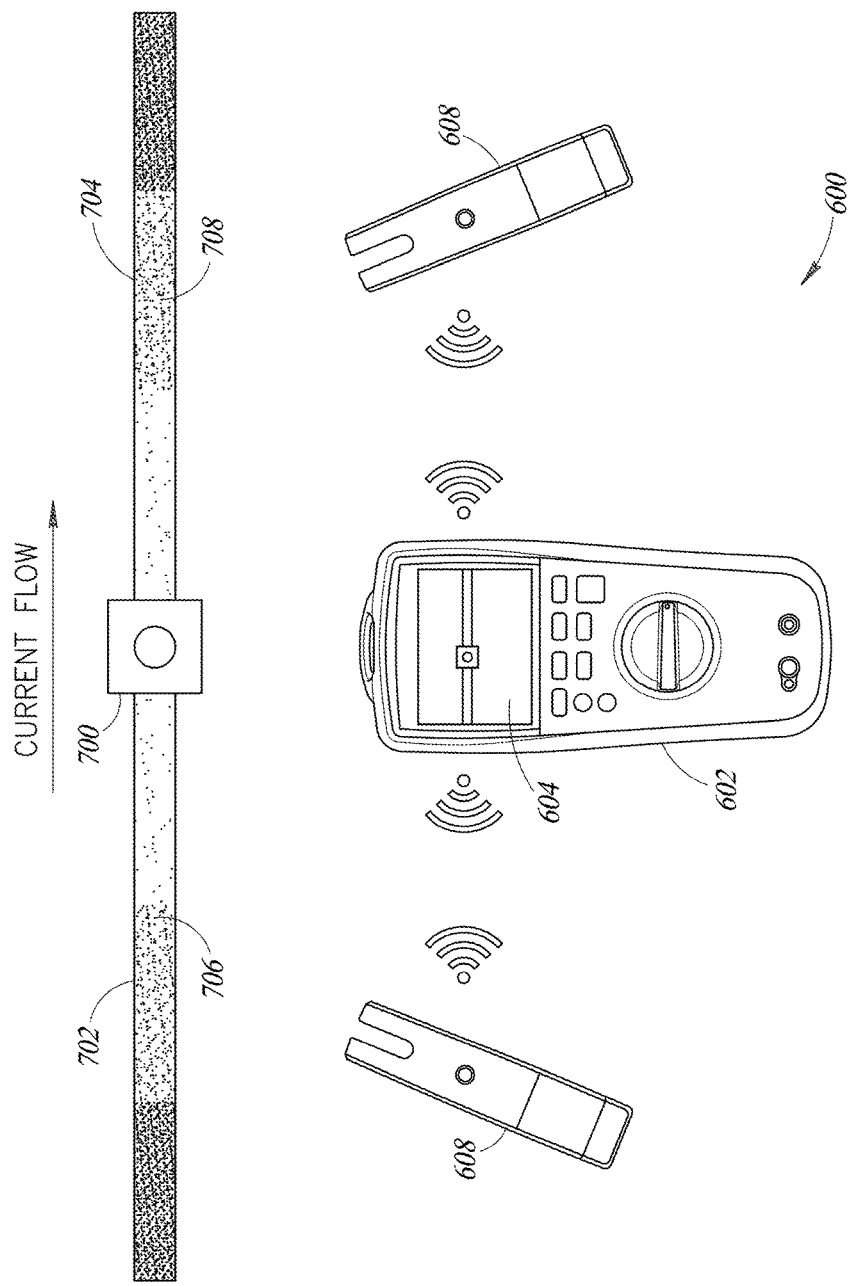
FIG. 7 shows an example operation of the thermal non-contact voltage and non-contact current measurement device of FIG. 6 when used to detect abnormal heat conditions in an electrical connector that connects two electrical conductors, according to one illustrated implementation.

FIG. 7 shows an example operation of the measurement device 600 of FIG. 6. In this example, the thermal imaging tool of the master device 602 is used to image an electrical connector 700 of an electrical circuit that connects a first electrical conductor 702 to a second electrical conductor 704. The display 604 of the master device 602 shows a heat profile of the electrical connector 700 and conductors 702 and 704, which indicates that the electrical connector is an area of high electrical resistance. In FIG. 7, shading is used to show the heat profile, with less shading indicating areas of higher heat dissipation and more shading indicating areas of lower heat dissipation. In at least some implementations, the display 604 may utilize various colors to depict the heat pattern of the electrical circuit.

Once the user and/or the master device 602 has identified the electrical connector 700 as a potential area of excessive heat generation, the user may obtain various current and voltage measurements for the electrical connector. For example, the user may position one of the non-contact sensor tools 608 proximate a first location 706 of the first conductor 702 on one side of the connector 700, and may position another of the non-contact sensor tools 608 proximate a second location 708 of the second conductor 704 on an opposite side of the connector 700. Each of the non-contact sensor tools 608 may be operative to measure voltage and/or current without requiring galvanic contact with the conductors 702 and 704, as described above. As an example, the two sensor tools 608 may be positioned at the locations 706 and 708 to measure a voltage drop across the electrical connector 700. In at least some implementations, two or more sensors (e.g., non-contact voltage sensors) may be used to concurrently measure two or more different locations of the electrical circuit. For example, two sensors on either side of a connector may be used to concurrently measure voltages on either side of the connector to provide an accurate measure of the voltage drop across the connector.

The sensors 608 may send the obtained measurement data to the master device 602 for processing and presentation on the display 604. As discussed above, the master device 602 may determine the voltage drop across the connector 700, the current flowing through the connector, the power loss in the connector, the cost of power loss in the connector over time, etc. Such information may be presented to the user on the display 604, and/or may be sent to one or more remoted devices via wired and/or wireless communications channels, as discussed above.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, all of the U.S. patents, U.S. patent application publications, U.S. patent applications, foreign patents, foreign patent applications and non-patent publications referred to in this specification, including U.S. Provisional Patent Application No. 62/068,392 filed Oct. 24, 2014, U.S. patent application Ser. No. 14/921,128 filed Oct. 23, 2015, U.S. Provisional Patent Application No. 62/051,930 filed Sep. 17, 2014, U.S. Provisional Patent Application No. 62/076,088 filed Nov. 6, 2014, U.S. patent application Ser. No. 14/856,046 filed Sep. 16, 2015, U.S. patent application Ser. No. 13/566,947 filed Aug. 3, 2012, and U.S. Provisional Patent Application No. 61/514,842 filed Aug. 3, 2011, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A non-contact measurement device, comprising:
a housing;
a thermal imaging tool disposed in or on the housing that, in operation, detects infrared radiation from a target scene that includes an electrical circuit and produces thermographic image data for the electrical circuit;
a non-contact voltage measurement tool (NVMT) that, in operation, senses a voltage in an insulated conductor of the electrical circuit without galvanically contacting the insulated conductor;
a non-contact current measurement tool (NCMT) that, in operation, senses a current in an insulated conductor of the electrical circuit without galvanically contacting the insulated conductor;
a display subsystem;
at least one nontransitory processor-readable storage medium that stores at least one of processor-executable instructions or data; and
at least one processor communicatively coupled to the at least one nontransitory processor-readable storage medium, the thermal imaging tool, the NVMT, the NCMT, and the display subsystem, in operation the at least one processor:
receives thermographic image data from the thermal imaging tool;
presents the thermographic image data via the display subsystem that indicates a presence or absence of abnormal heat generation locations in the electrical circuit; and
receives measurement data from at least one of the NVMT or the NCMT, the measurement data comprising at least one of a voltage sensor signal from the NVMT or a current sensor signal from the NCMT, the voltage sensor signal indicative of the voltage in an insulated conductor of the electrical circuit under test, and the current sensor signal indicative of the current in an insulated conductor of the electrical circuit under test.

2. The non-contact measurement device of claim 1 wherein the housing has no externally exposed conductive surfaces.

3. The non-contact measurement device of claim 1 wherein at least one of the NVMT, the NCMT, or the display subsystem is disposed in or on the housing.

4. The non-contact measurement device of claim 1 wherein the NVMT and the NCMT are each disposed in or on the housing.

5. The non-contact measurement device of claim 1 wherein at least one of the NVMT or the NCMT is disposed in a separate housing and is communicatively coupleable to the at least one processor via a wired or wireless connection.

6. The non-contact measurement device of claim 1 wherein, in operation, the at least one processor determines at least one electrical parameter based on the received measurement data, the determined at least one electrical parameter includes power.

7. The non-contact measurement device of claim 1 wherein, in operation, the at least one processor:
estimates an amount of power loss in an insulated conductor of the electrical circuit over a period of time; and
at least one of:
presents the estimated amount of power loss via the display subsystem; or
communicates the estimated amount of power loss to an external device over a wired or wireless communications interface.

8. The non-contact measurement device of claim 7 wherein the period of time comprises at least one of a number of days, a number of weeks, a number of months, or a number of years.

9. The non-contact measurement device of claim 7 wherein, in operation, the at least one processor estimates the amount of power loss in the insulated conductor relative to an expected amount of power loss in the insulated conductor.

10. The non-contact measurement device of claim 7 wherein, in operation, the at least one processor:
determines an estimated cost associated with the estimated amount of power loss; and
presents the estimated cost via the display subsystem.

11. The non-contact measurement device of claim 1, wherein the NVMT comprises at least two non-contact voltage sensors which allow for concurrent measurement of two different locations of the electrical circuit.

12. The non-contact measurement device of claim 1 wherein the NCMT comprises at least one of a fluxgate sensor, a Hall Effect sensor, a Rogowski coil, a current transformer, or a giant magnetoresistance (GMR) magnetic sensor.

13. The non-contact measurement device of claim 1 wherein the NVMT comprises at least one of a capacitive divider type voltage sensor, a reference signal type voltage sensor, or a multi-capacitor type voltage sensor.

14. The non-contact measurement device of claim 1 wherein, in operation, the at least one processor:
receives a voltage sensor signal from the NVMT obtained by the NVMT during a measurement time interval;
receives a current sensor signal from the NCMT obtained by the NCMT during the measurement time interval; and
determines at least one alternating current (AC) electrical parameter based on the received voltage sensor signal and the received current sensor signal.

15. The non-contact measurement device of claim 1 wherein, in operation, the at least one processor causes the display subsystem to present the determined at least one AC electrical parameter.

16. The non-contact measurement device of claim 1 further comprising a wired or wireless communications interface operatively coupled to the at least one processor, wherein, in operation, the at least one processor sends, via the communications interface, data to at least one external device, wherein the data is associated with at least one of the thermographic image data, the voltage sensor signal, the current sensor signal, or the determined at least one AC electrical parameter.

17. The non-contact measurement device of claim 16 wherein the communications interface comprises a wireless communications interface that, in operation, wirelessly sends the data to the at least one external device.

18. A method of operating a non-contact measurement device, the method comprising:
detecting, via a thermal imaging tool disposed in or on a housing of the non-contact measurement device, infrared radiation from a target scene that includes an electrical circuit;
producing, via the thermal imaging tool, thermographic image data for the electrical circuit;
receiving, by at least one processor, the thermographic image data from the thermal imaging tool;
presenting, via a display subsystem, the thermographic image data that indicates a presence or absence of abnormal heat generation locations in the electrical circuit;
at least one of:
sensing, via a non-contact voltage measurement tool (NVMT), a voltage in an insulated conductor of the electrical circuit without galvanically contacting the insulated conductor; or
sensing, via a non-contact current measurement tool (NCMT), a current in an insulated conductor of the electrical circuit without galvanically contacting the insulated conductor;
receiving, by the at least one processor, measurement data from at least one of the NVMT or the NCMT, the measurement data comprising at least one of a voltage sensor signal from the NVMT or a current sensor signal from the NCMT, the voltage sensor signal indicative of the voltage in an insulated conductor of the electrical circuit under test, and the current sensor signal indicative of the current in an insulated conductor of the electrical circuit under test; and
determining, by the at least one processor, at least one alternating current (AC) electrical parameter based on the received measurement data.

19. The method of claim 18 wherein the method comprises:
sensing, via a non-contact voltage measurement tool (NVMT), a voltage in an insulated conductor of the electrical circuit without galvanically contacting the insulated conductor; and
sensing, via a non-contact current measurement tool (NCMT), a current in an insulated conductor of the electrical circuit without galvanically contacting the insulated conductor,
wherein determining at least one AC electrical parameter comprises determining AC power.

20. The method of claim 18, further comprising:
estimating, by the at least one processor, an amount of power loss in an insulated conductor of the electrical circuit over a period of time; and
at least one of:
presenting the estimated amount of power loss via the display subsystem; or
communicating the estimated amount of power loss to an external device over a wired or wireless communications interface.

21. The method of claim 20, further comprising:
determining, by the at least one processor, an estimated cost associated with the estimated amount of power loss; and
presenting the estimated cost via the display subsystem.

22. The method of claim 18, wherein sensing a voltage in an insulated conductor of the electrical circuit without galvanically contacting the insulated conductor the NVMT comprises concurrently sensing two different locations of the electrical circuit with two non-contact voltage sensors to obtain a voltage drop between the two different locations of the electrical circuit.

23. A non-contact measurement device, comprising:
a thermal imaging tool that, in operation, detects infrared radiation from a target scene that includes an electrical circuit and produces thermographic image data for the electrical circuit;
a non-contact voltage measurement tool (NVMT) that, in operation, senses a voltage in an insulated conductor of the electrical circuit without galvanically contacting the insulated conductor;
a non-contact current measurement tool (NCMT) that, in operation, senses a current in an insulated conductor of the electrical circuit without galvanically contacting the insulated conductor;
at least one nontransitory processor-readable storage medium that stores at least one of processor-executable instructions or data; and
at least one processor communicatively coupled to the at least one nontransitory processor-readable storage medium, the thermal imaging tool, the NVMT, and the NCMT, and in operation the at least one processor:
receives thermographic image data from the thermal imaging tool;
provides an indication of a presence or absence of abnormal heat generation locations in the electrical circuit based at least in part on the received thermographic image data;
receives measurement data from at least one of the NVMT or the NCMT, the measurement data comprising at least one of a voltage sensor signal from the NVMT or a current sensor signal from the NCMT, the voltage sensor signal indicative of the voltage in an insulated conductor of the electrical circuit under test, and the current sensor signal indicative of the current in an insulated conductor of the electrical circuit under test; and
presents at least a portion of the measurement data via the display subsystem in connection with providing an indication based at least in part on the received thermographic image data.

* * * * *